United States Patent
Masuko

(10) Patent No.: US 7,200,924 B2
(45) Date of Patent: Apr. 10, 2007

(54) METHOD OF PACKAGING ELECTRONIC PARTS

(75) Inventor: Shingo Masuko, Suzaka (JP)

(73) Assignee: Fujitsu Media Devices Limited, Yokohama (JP)

( * ) Notice: Subject to any disclaimer, the term of this patent is extended or adjusted under 35 U.S.C. 154(b) by 258 days.

(21) Appl. No.: 10/777,135

(22) Filed: Feb. 13, 2004

(65) Prior Publication Data

US 2004/0160750 A1    Aug. 19, 2004

(30) Foreign Application Priority Data

Feb. 14, 2003  (JP)  ............................ 2003-036749

(51) Int. Cl.
*H05K 3/30*  (2006.01)

(52) U.S. Cl. .................... 29/832; 29/25.35; 29/415; 29/834; 29/835; 257/459; 257/798; 438/108; 438/113; 438/118

(58) Field of Classification Search ............... 29/25.35, 29/592.1, 601, 832, 841, 846, 834, 835, 415, 29/417; 257/778, 786, 784, 459, 798; 310/313 R, 310/340, 344, 346, 334; 333/133, 193–196; 361/760, 761; 438/106–118
See application file for complete search history.

(56) References Cited

U.S. PATENT DOCUMENTS

| | | | |
|---|---|---|---|
| 5,991,989 A * | 11/1999 | Onishi et al. .............. | 29/25.35 |
| 6,268,236 B1 * | 7/2001 | Miyawaki ................... | 438/106 |
| 6,310,421 B2 * | 10/2001 | Morishima .............. | 310/313 R |
| 6,698,084 B2 * | 3/2004 | Uchikoba .................... | 29/601 |
| 6,923,958 B2 * | 8/2005 | Xiang et al. ................ | 438/118 |

FOREIGN PATENT DOCUMENTS

| | | |
|---|---|---|
| JP | 2001-53577 | 2/2001 |
| JP | 2001-110946 | 4/2001 |

* cited by examiner

*Primary Examiner*—Minh Trinh
*Assistant Examiner*—Donghai D. Nguyen
(74) *Attorney, Agent, or Firm*—Arent Fox LLP

(57) ABSTRACT

A method of fabricating electronic parts includes the steps of: mounting electronic elements in regular cavities that are two-dimensionally arranged on a baseboard on which dummy cavities are provided so as to surround the regular cavities, and covering a top of the baseboard with a resin sheet.

13 Claims, 9 Drawing Sheets

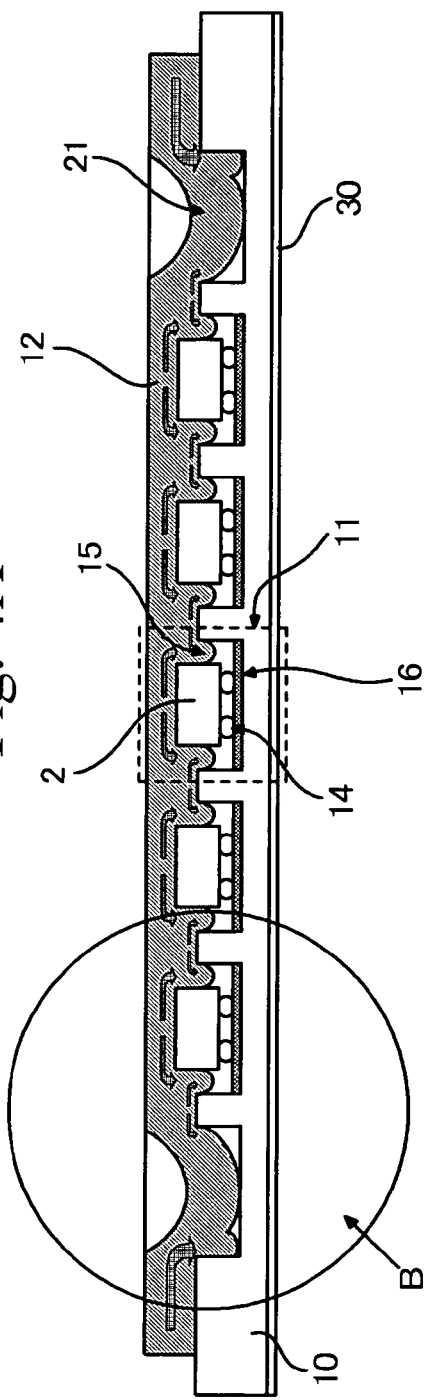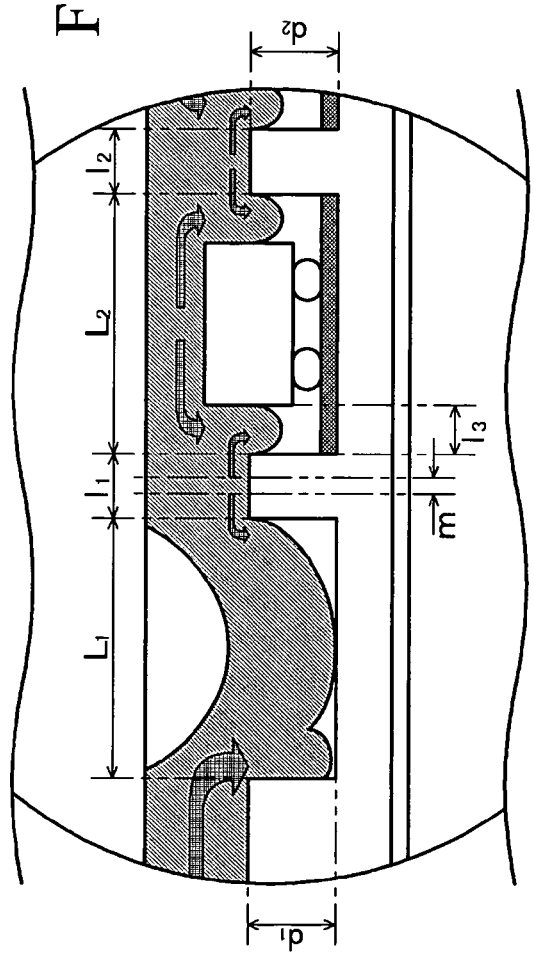

METHOD OF PACKAGING ELECTRONIC PARTS

BACKGROUND OF THE INVENTION

1. Field of the Invention

The present invention generally relates to a method of fabricating electronic parts packaged with resin and a baseboard suitably used for the method.

2. Description of the Related Art

Recently, there has been a demand to downsize electronic parts mounted to electronic devices and improve the performance thereof with downsizing and higher performance of the electronic devices. For instance, there have been similar demands on surface acoustic wave (SAW) devices that are electronic parts used as filters, delay lines, oscillators in electronic devices capable of transmitting and receiving radio waves.

Generally, SAW devices have a SAW filter chip that is flip-chip mounted within a cavity having a bottom surface on which interconnection lines are formed. An interdigital transducer having comb-like electrodes is formed on a piezoelectric substrate of the SAW filter chip. This type of SAW devices is disclosed in Japanese Laid-Open Patent Application Publication No. 2001-53577, particularly, FIG. 3.

The SAW device of the above-mentioned type may be fabricated as shown in FIGS. 1 and 2 in which FIG. 2 is a cross-sectional view taken along a line A—A shown in FIG. 1. Multiple SAW devices 111 are produced on a single baseboard 110. The baseboard 110 is divided into separate SAW devices 110 by a laser beam or dicing blade. The fabrication process of this type, which is described in, for example, Japanese Laid-Open Patent Application Publication No. 2001-110946, particularly, FIG. 7, results in many SAW devices at a time.

More specifically, cavities 115 are two-dimensionally arranged on the baseboard 110. The bottoms of the cavities 115 are metallized to form electrode pads 116 for bumps 114. A wiring board 130 is provided on the bottom of the baseboard 110. The SAW filter chips 113 are bonded to the electrode pads 116 in the facedown state by bumps 114. A resin sheet 112 is placed on the entire surface of the baseboard 110. Then, the baseboard 110 is divided into the separate SAW devices 111 that are hermetically sealed with resin. The productivity and cost can be improved by mounting the SAW devices 111 as many as possible.

However, the conventional fabrication method has the following disadvantages. In the process of sealing the baseboard 110 with the resin sheet 112, resin may deeply enter into the cavities 115 located at the outermost positions of the two-dimensional arrangement. The resin that deeply enters into the cavities may degrade the filter characteristic and environmental capability of the SAW devices 111. The faulty SAW devices 111 thus produced may not be shipped. If the resin comes into contact with the comb-like electrodes, the SAW devices 111 are absolutely defective. Many SAW devices located at the outermost positions may be defective, so that the production yield reduces and the cost increases.

SUMMARY OF THE INVENTION

It is a general object of the present invention to provide a method of fabricating electronic parts packaged with resin and a baseboard suitably used for the method.

A more specific object of the present invention is to fabricate electronic parts at a reduced cost and an improved yield.

The above objects of the present invention are achieved by a method of fabricating electronic parts comprising the steps of: (a) mounting electronic elements in regular cavities that are two-dimensionally arranged on a baseboard on which dummy cavities are provided so as to surround the regular cavities; and (b) covering a top of the baseboard with a resin sheet.

The above objects of the present invention are also achieved by baseboard used for electronic parts sealed with resin comprising: regular cavities that can house electronic elements and are two-dimensionally arranged; and dummy cavities arranged so as to surround the regular cavities.

BRIEF DESCRIPTION OF THE DRAWINGS

Other objects, features and advantages of the present invention will become more apparent from the following detailed description when read in conjunction with the accompanying drawings in which:

FIG. 4A is a cross-sectional view taken along a line A—A shown in FIG. 3;

FIG. 4B is an enlarged view of a part B shown in FIG. 4A;

DESCRIPTION OF THE PREFERRED EMBODIMENTS

A description will now be given of embodiments of the present invention with reference to the accompanying drawings.

(First Embodiment)

Figure 1:
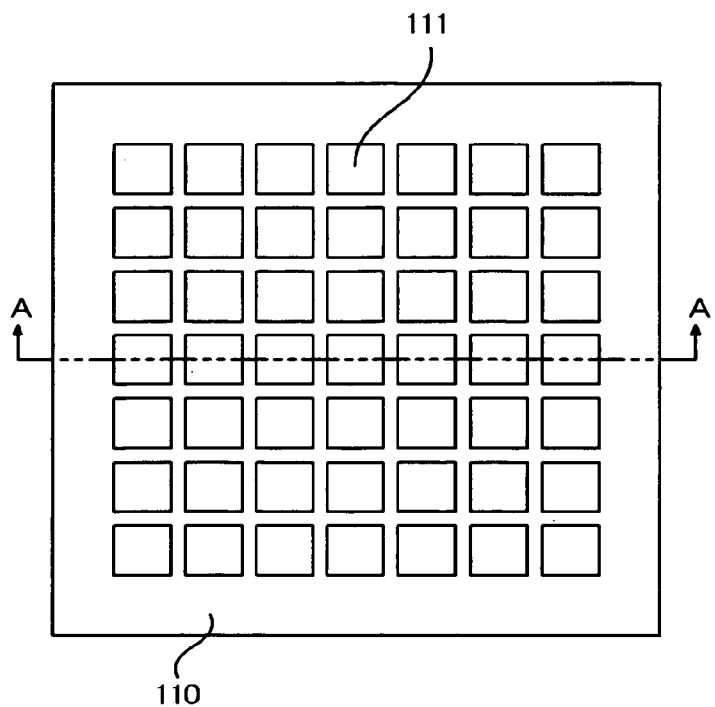
FIG. 1 is a plan view of a conventional baseboard.
Figure 3:
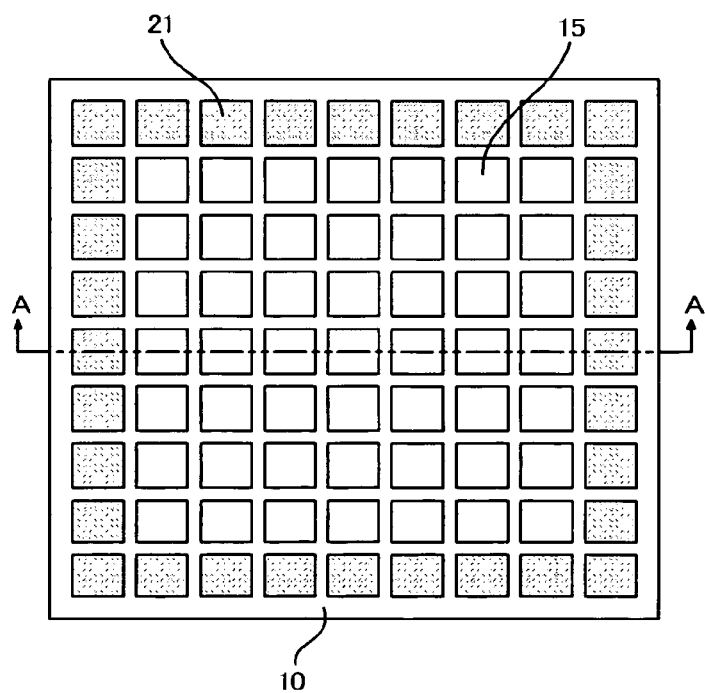
FIG. 3 is a plan view of a baseboard according to a first embodiment of the present invention.
Figure 2:
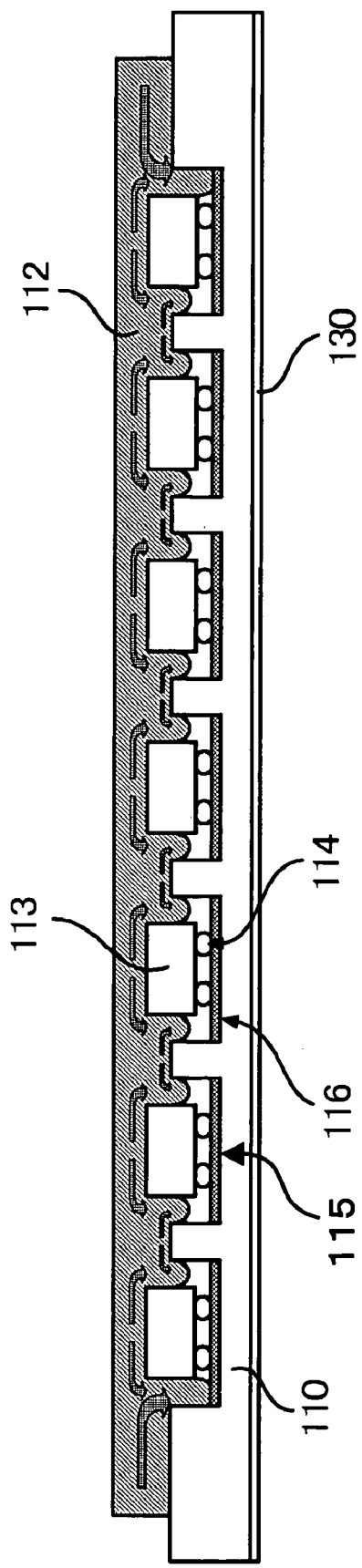
FIG. 2 is a cross-sectional view taken along a line A—A shown in FIG. 1.

FIG. 3 is a plan view of a baseboard 10 according to a first embodiment of the present invention. Cavities 15 in which SAW filter elements 2 are housed are formed on the upper or main surface of the baseboard 10. The baseboard 10 has a two-dimensional array of cavities 15. Dummy cavities 21 are provided at the outermost positions of the two-dimensional array. The regular cavities 15 are surrounded by the dummy cavities 21. The dummy cavities 21 are arranged in rows and columns of the two-dimensional arrangement of the regular cavities 21.

The dummy cavities 21 have the same shape as that of the regular cavities 15 in which the SAW filter chips 2 are mounted. For instance, the regular cavities 15 and the dummy cavities 21 are 1,60 mm long and 1.20 mm wide, and are arranged at a pitch of 0.90 mm.

FIG. 4A is a cross-sectional view taken along a line A—A shown in FIG. 3, and FIG. 4B is an enlarged cross-sectional view of a part B shown in FIG. 4A.

As shown in FIG. 4A, the bottoms of the regular cavities 15 are metallized to form electrode pads 16 for the bumps 14. The SAW filter chips 2 are facedown bonded to the electrode pads 16 in the regular cavities 15 so that electrode pads on the piezoelectric substrates of the SAW filter chips 2 are bonded to the electrode pads 16 by the bumps 14. Thus, the pads of the SAW filter chips 2 are electrically and mechanically connected to the pads 16 of the baseboard 10. Although the dummy cavities 21 may be metallized, metallization to the dummy cavities 21 is preferably omitted in terms of simplification in the production and cost reduction.

After the SAW filter chips 2 are mounted, a resin sheet 12 is placed on the upper plan of the baseboard 10 and is bonded to the chips 2 and the baseboard 10 while applying heat to the sheet 12. Thus, the cavities 15 that house the filter SAW filter chips 2 are hermetically sealed with the resin sheet 12. The resin sheet 12 enters into the dummy cavities 21 during bonding. This prevents the resin of the sheet 12 more than requires from entering into the outermost regular cavities 15. The dummy cavities 21 serve as relief cavities for softened resin and control the flow of resin that enters into the outermost regular cavities 15. Thus, the SAW devices 11 produced from the outermost regular cavities 15 have almost the same filter characteristic and environmental capability as those of the remaining SAW devices 11 that are further in than the outermost regular cavities. This improves the production yield and reduces the cost.

As shown in FIG. 4B, the dummy cavities 21 may have a depth $d_1$ equal to a depth $d_2$ of the regular cavities 15. However, the dummy cavities 21 may have an appropriate range in depth in which an appropriate amount of resin is caused to enter into the regular cavities 15. For example, the depth $d_1$ of the dummy cavities 21 may be equal to or longer than 50 μm. Preferably, the dummy cavities 21 penetrate through the baseboard 10. In the first embodiment, the dummy cavities 21 are 0.25 mm deep.

The length $L_1$ of the dummy cavities 21 may be equal to the length $L_2$ of the regular cavities 15. Of course, the dummy cavities 21 may have an appropriate range in length in which an appropriate amount of resin is caused to enter into the regular cavities 15 as in the case of the depth $d_1$. For example, the length $L_1$ of the dummy cavities 21 may be equal to or longer than a gap $l_3$ from the sidewalls of the regular cavities 15 to the SAW filter chips 2. This setting prevents an excessive amount of resin from entering into the regular cavities 15. In the most preferable case, an identical amount of resin may enter into each of the cavities 15 and 21.

The thickness $l_2$ of the walls that separate the adjacent regular cavities 15 from each other and the thickness $l_1$ of the walls that separate the regular cavities 15 and the dummy cavities 21 from each other are preferably as thin as possible taking the following into consideration. The first factor to be considered is the required strength of the walls of the SAW devices 11 after dicing. The SAW devices after dicing have a wall thickness $l_4$ equal to $(l_1-m)/2$ where m denotes the thickness of cutoff portions removed from the walls by dicing (m is referred to as dicing clearance). The second factor to be considered is the productivity that can be improved by increasing the integration. The third factor is the unit cost of the SAW devices 11. For example, the dicing clearance m is equal to or greater than 100 μm, and the wall thickness $l_4$ after dicing is equal to or greater than 150 μm. In this case, the wall thickness $l_1$ before dicing is equal to or greater than 400 μm.

The above example assumes that the regular cavities 15 and the dummy cavities 21 are arranged at the identical pitch, so that $l_1=l_2 \geq 400$ μm. The pitch may be varied as long as the length $l_4$ meets the requirement ($l_4 \geq 150$ μm) so that resin can enter into the dummy cavities 21.

A description will now be given, with reference to FIGS. 5A through 5G, of a method of fabricating the SAW devices 11 according to the first embodiment of the present invention.

Figure 5A:
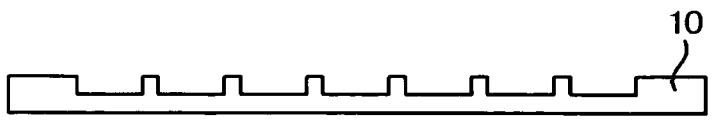
FIGS. 5A, 5B, 5C, 5D, 5E, 5F and 5G respectively show a process of fabricating SAW devices according to the first embodiment of the present invention.

As shown in FIG. 5A, multiple boards containing, for example, ceramics (including alumina ceramics) are laminated, so that the baseboard 10 having the regular cavities 15 and the dummy cavities 21 can be formed. Instead of ceramics, the baseboard 10 may be made of BT resin containing bismaleimide and triazine or may be a flexible board.

Figure 5B:
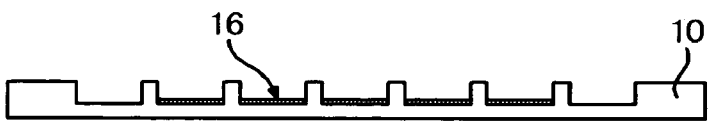

Next, as shown in FIG. 5B, only the bottoms of the regular cavities 15 are metallized to form the electrode pads 16 for bumps. In metallization, a resist film may be used to avoid deposition of metal in areas other than the bottoms of the regular cavities 15. If the bottoms of the dummy cavities 21 are simultaneously metallized, the resist film may not be needed.

In the above process, via interconnections (see a reference numeral 17 shown in FIG. 8) for electrically connecting the electrode pads 16 and the backside of the baseboard 10 may be formed in the process of FIG. 5A in advance or in the process of FIG. 5B together with the electrode pads 16. When the via interconnections 17 are formed in advance, one or more boards having the via interconnections 17 are laminated, and other boards that define the two-dimensional array of the cavities 15 and 21 are then laminated. The electrode pads 16 may be formed in the process of FIG. 5A. In this case, the top surface of the single board or a laminate of boards is metallized so as to correspond to the cavities 15 and 21, and the remaining boards that define these cavities are laminated subsequently.

Figure 5C:
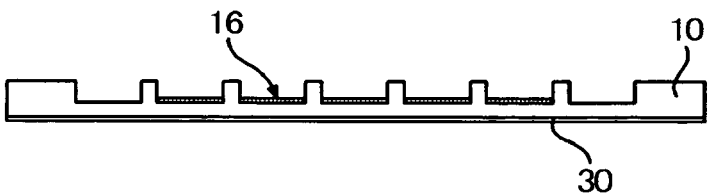

Then, as shown in FIG. 5C, a wiring board 30 is adhered to the bottom of the baseboard 10. The wiring board 30 has on-board interconnection lines 32 (see, a reference numeral 32 in FIG. 11) that have positional correspondence to the via interconnections 17 exposed from the bottom of the baseboard 10. Thus, the electrode pads 16 and the on-board interconnection lines 32 are electrically connected. The on-board interconnection lines 32 are electrically connected to terminals 31 (see FIGS. 9 and 10) provided on the backside of the wiring board 30 by means of via interconnections 33 (see FIG. 10) that penetrate through the wiring board 30. Thus, the electrode pads 16 on the bottoms of the cavities 15 are electrically connected to the terminals 31.

Figure 5D:
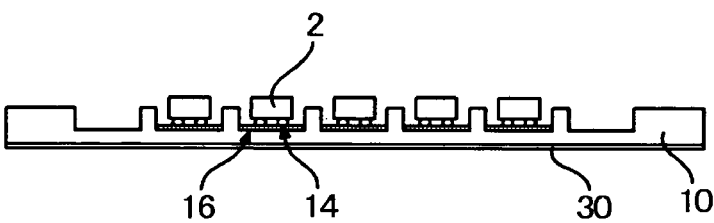

After that, as shown in FIG. 5D, the SAW filter chips 2 are facedown bonded in the regular cavities 15 so that the IDTs face the bottoms of the regular cavities 15. The pads on the chips 2 are electrically and mechanically bonded to the electrode pads 16 by the bumps 14, which may be made of gold, for example.

Figure 5E:
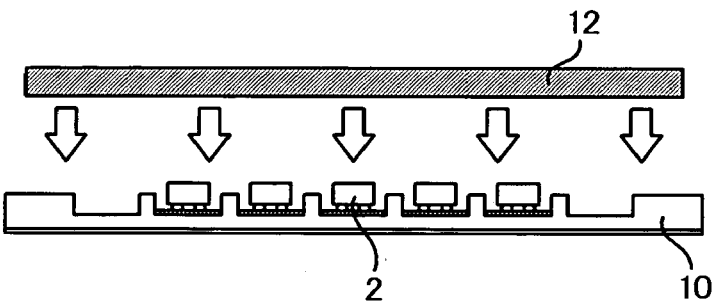
Figure 5F:
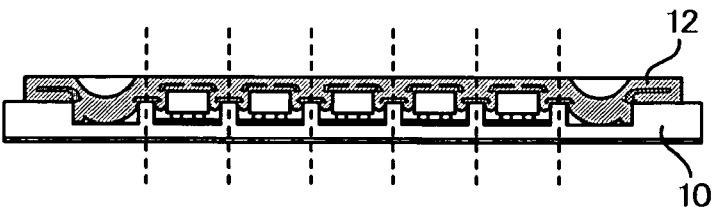
Figure 5G:

Then, as shown in FIG. 5E, the resin sheet 12 is laminated on the top of the baseboard 10 so as to cover the regular cavities 15 and the dummy cavities 21. Thereafter, as shown in FIG. 15F, the resin sheet 12 is pressurized while heating, so that the resin sheet 12 is adhered to the top of the baseboard 10. The wiring board 30 may be adhered to the bottom of the baseboard 10 after the step of FIG. 5D or 5E.

Figure 6:
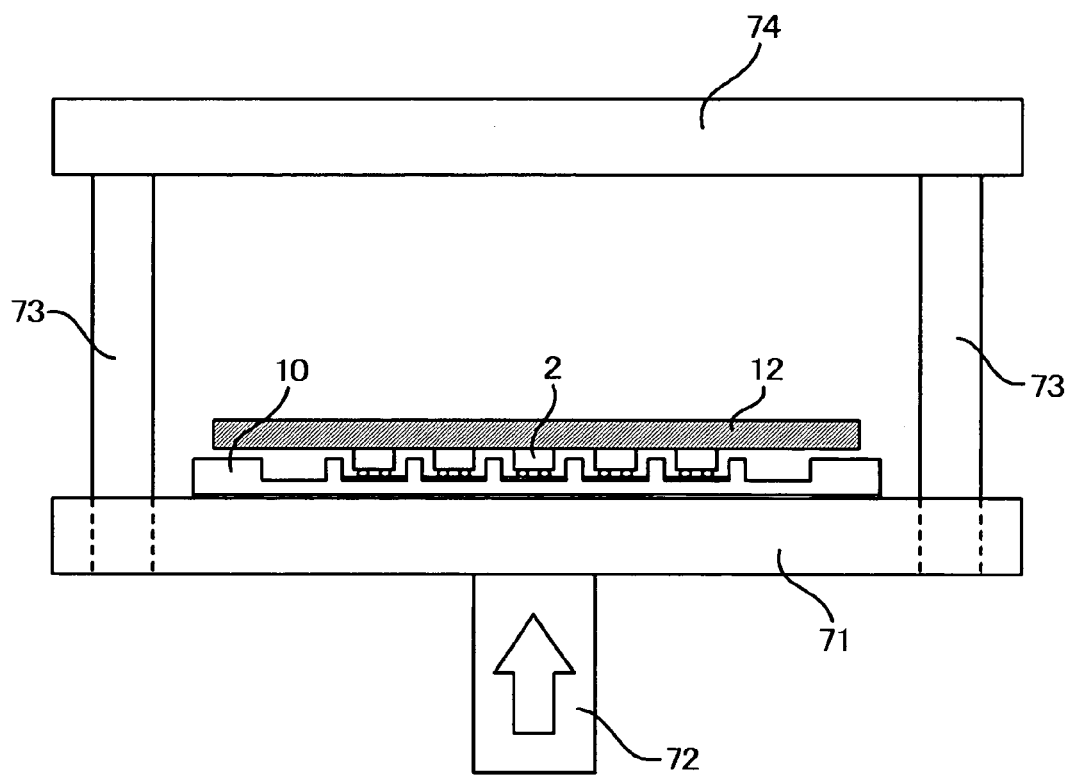
FIG. 6 schematically illustrates an apparatus that pressurizes a resin sheet on the baseboard while heating.

FIG. 6 shows how the resin sheet 12 is adhered to the baseboard 10 with applying pressure and heat thereto. The baseboard 10 with the resin sheet 12 is placed on a lower mold 71, which is being heated by a heater or the like, which is not shown for the sake of simplicity. The lower mold 71 can be moved by a motor 72 along posts 73. The resin sheet 12 is pressed by the lower mold 71 and an upper mold 74 while the baseboard 10 is heated. The resin sheet 12 is softened and is adhered to the top of the baseboard 10.

The baseboard 10 with the two-dimensional array of the SAW devices 11 is divided into separate SAW devices 11 by a laser beam or dicing blade.

Examples of the baseboard 10 and the wiring board 30 will now be described.

Figure 7:
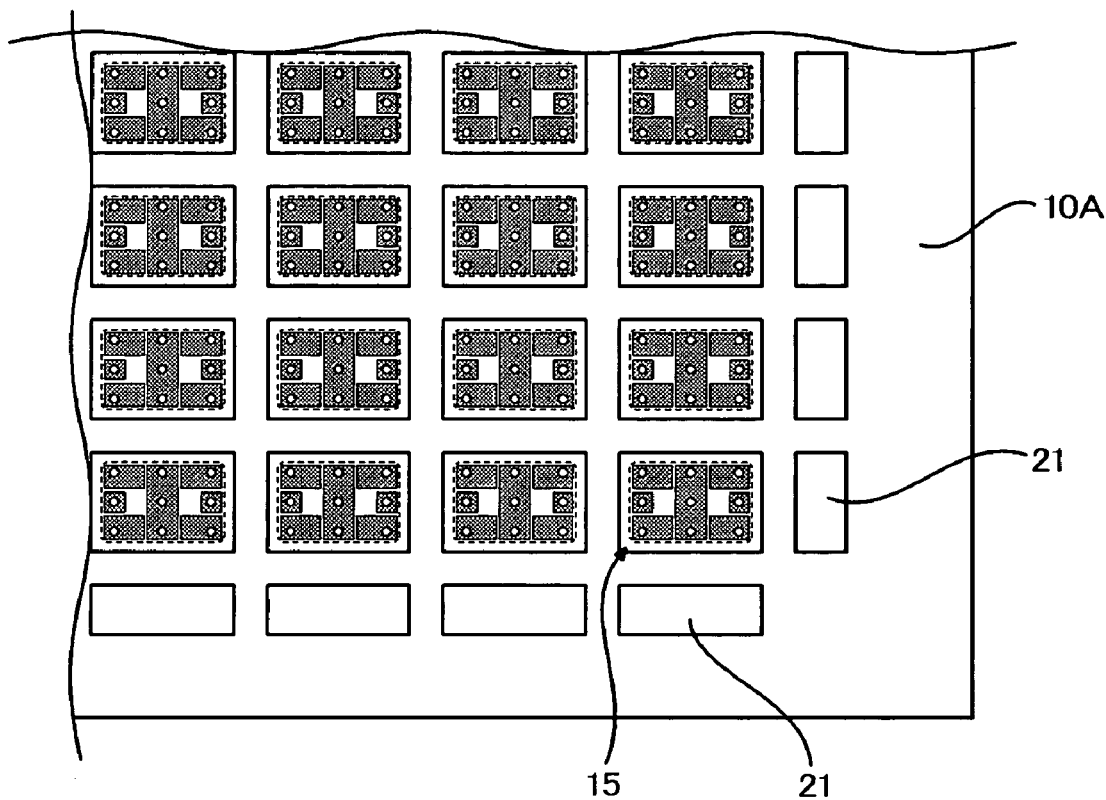
FIG. 7 is a plan view of a corner part of a baseboard according to the first embodiment of the present invention.

FIG. 7 is a plan view of a corner portion of a baseboard 10A, which has the dummy cavities 21 that are arranged at the same pitch as that of the regular cavities 15 and are located further out than the two-dimensional array of the regular cavities 15. The dummy cavities 21 have the same length and width as those of the regular cavities 15.

Figure 8:
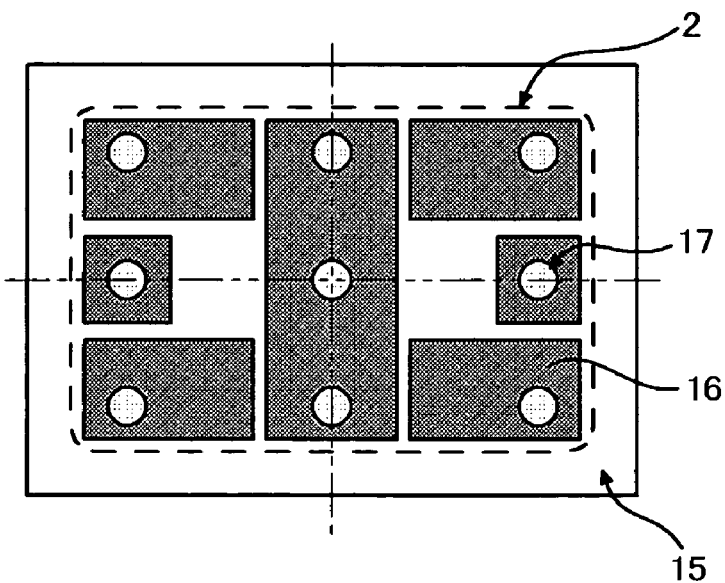
FIG. 8 shows one of regular cavities arranged two-dimensionally in the baseboard shown in FIG. 7.

The bottoms of the regular cavities 15 are provided with the electrode pads 16, as shown in FIG. 8. In the present example, the bottoms of the dummy cavities 21 are not metallized. The SAW filter chip 2 is mounted on the area surrounded by the broken line shown in FIG. 8. The electrode pads 16 on the bottom of the regular cavity 15 are connected to the bottom of the baseboard 10A by the via interconnections 17.

Figure 9:
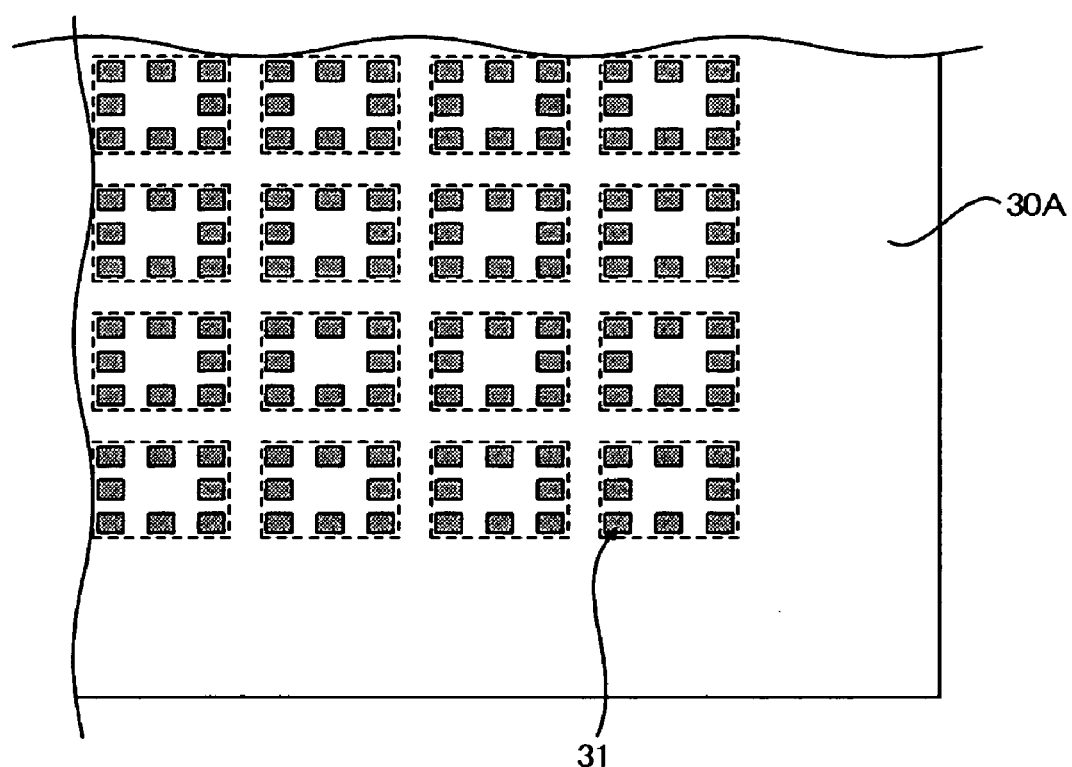
FIG. 9 is a plan view of a corner part of a wiring board attached to the backside of the baseboard shown in FIG. 7.
Figure 10:
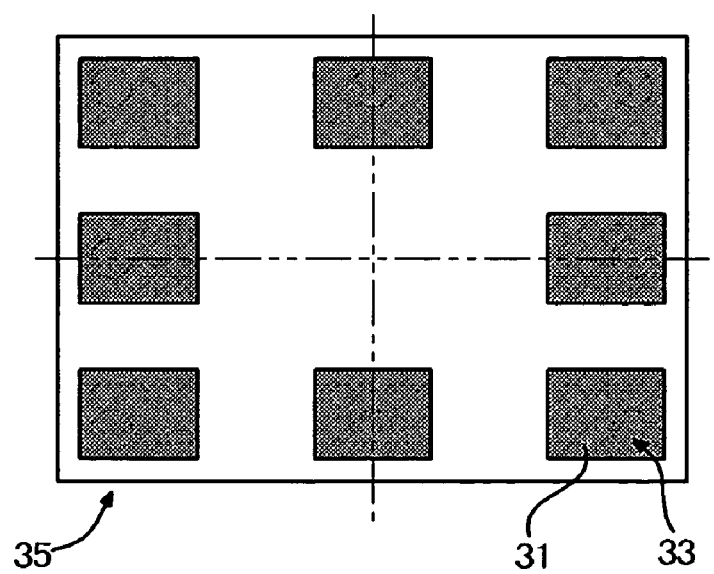
FIG. 10 shows an arrangement of terminals provided on a lower surface of the wiring board and associated with one regular cavity.
Figure 11:
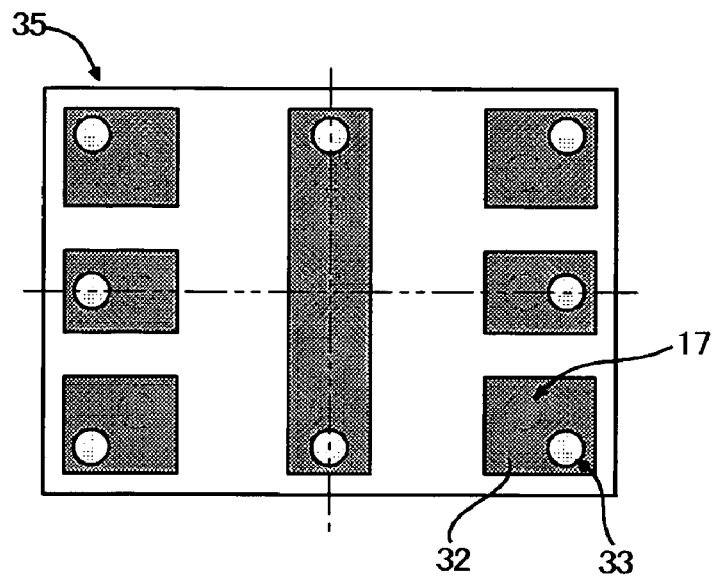
FIG. 11 shows an arrangement of terminals provided on an upper surface of the wiring board and associated to the arrangement of terminals shown in FIG. 10.

The wiring board 30A is attached to the backside of the baseboard 10A, as shown in FIGS. 9 through 11. FIG. 9 shows the backside of the wiring board 30A, and FIG. 10 shows an arrangement of the terminals 31, which arrangement is provided on a cavity-based area 35 on the back surface of the wiring board 30A. FIG. 11 shows an arrangement of the on-board interconnection lines 32 and the via interconnections 33 on the upper surface of the wiring board 30A.

As shown in FIG. 9, groups of multiple electrodes 31 are arranged on the back surface of the wiring board 30A on the cavity basis. One group of multiple electrodes 31 is associated with one of the regular cavities 15. A group of terminals 31 is shown in more detail in FIG. 10. The terminals 31 and the via interconnections 33 that penetrate through the wiring board 30A are provided in the cavity-based area 35. The terminals 31 are used to make external connections. The terminals 31 may be used to make mechanical connections if the terminals 31 are bonded to an external circuit (board) by solder.

The on-board interconnection lines 32 and the via interconnections 33 are provided in the cavity-based area 35 on the upper surface of the wiring board 30A. Each interconnection line 32 is positioned so as to connect the via interconnections 33 to the via interconnections 17 exposed from the backside of the baseboard 10A.

The baseboard 10A and the wiring board 30 are mutually positioned and joined, so that electric connections can be made between the electrode pads 16 and the terminals 31 and the SAW filter chip 11 can be supplied with signals.

There is no need to provide the pads 16, terminals 17 and 31, the interconnection lines 32 and via interconnections 33 on the upper and lower surfaces of the wiring board 30A so as to correspond to the dummy cavities 21.

According to the first embodiment of the present invention, the defective fraction of the SAW devices 11 located at the outermost positions can be drastically reduced to 0% from 85%.

(Second Embodiment)

Figure 12:
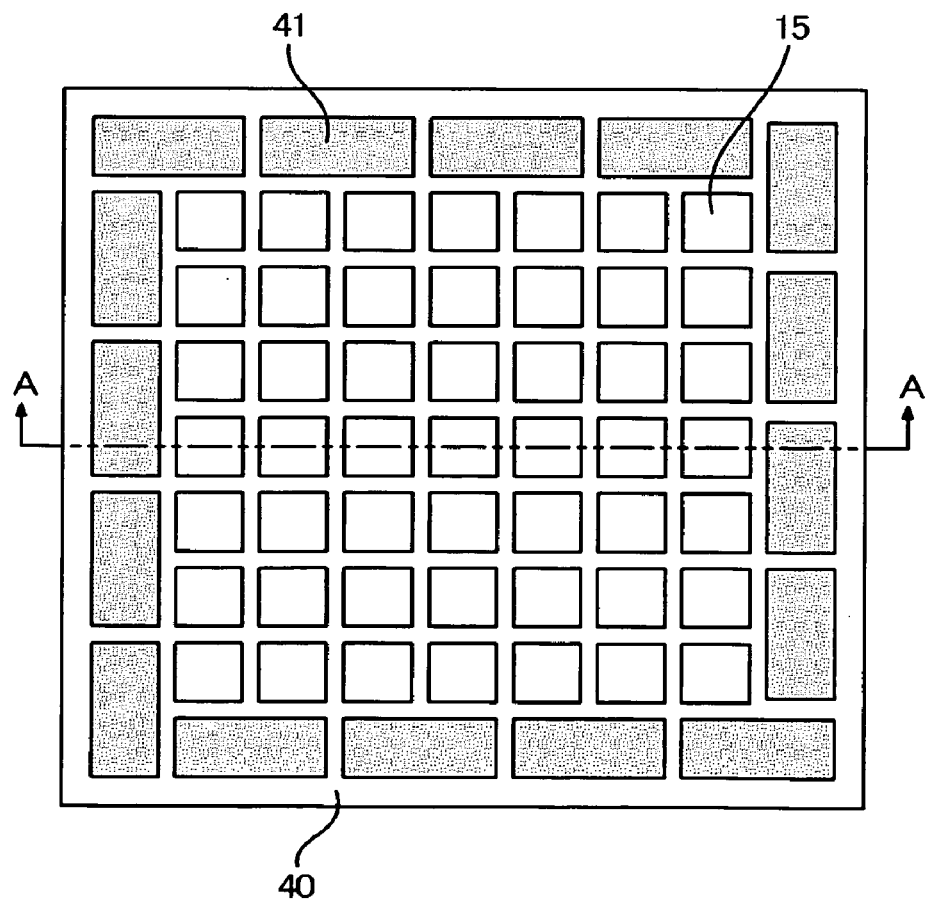
FIG. 12 is a plan view of a baseboard according to a second embodiment of the present invention.

FIG. 12 is a plan view of a baseboard 40 according to the second embodiment of the present invention. The baseboard 40 has dummy cavities 41 formed as if the two adjacent cavities 21 employed in the first embodiment of the invention are unified. Similarly, another cavity formed as if three or more dummy cavities 21 are unified may be employed. Each dummy cavity 41 is common to two rows or columns of the two-dimensional array of the regular cavities 15. The dummy cavities 41 that surround the two-dimensional array of the regular cavities 15 bring about effects similar to those of the first embodiment mentioned before. The baseboard 40 may be fabricated in the same manner as the baseboard 10.

(Third Embodiment)

Figure 13:
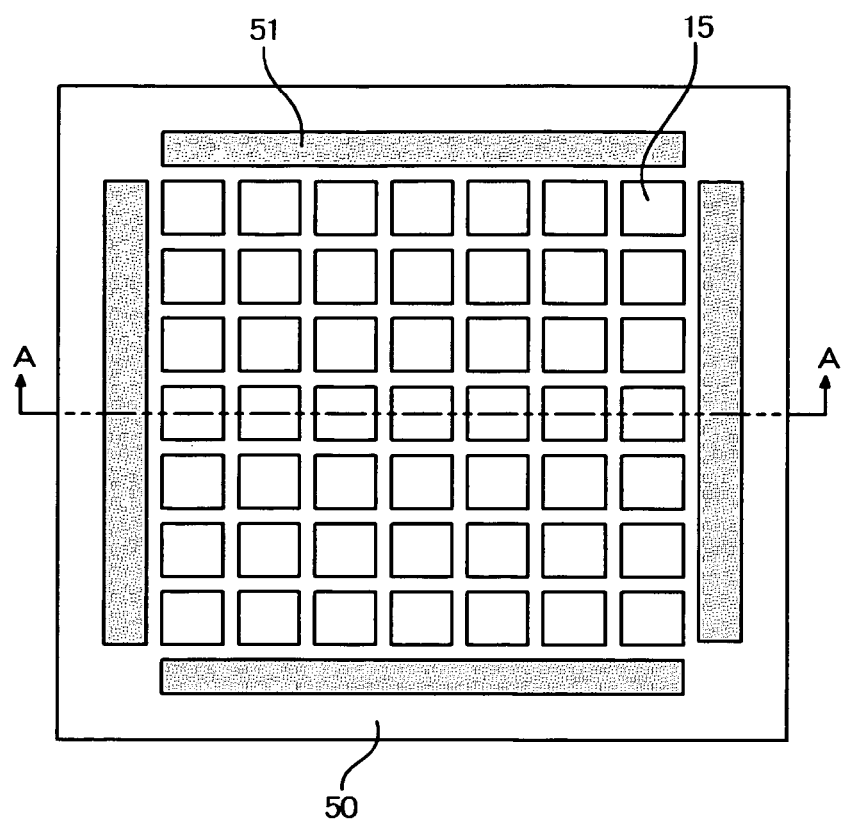
FIG. 13 is a plan view of a baseboard according to a third embodiment of the present invention.

FIG. 13 is a plan view of a baseboard 50 according to a third embodiment of the present invention. The baseboard 50 has four dummy cavities 51, each of which may be formed as if the dummy cavities 15 arranged in a line are unified. The dummy cavities 51 are each provided along the respective sides of the baseboard 50. The dummy cavities 51 that surround the two-dimensional array of the regular cavities 15 bring about effects similar to those of the first and second embodiments mentioned before. The baseboard 50 may be fabricated in the same manner as the baseboards 10 and 40.

(Fourth Embodiment)

Figure 14:
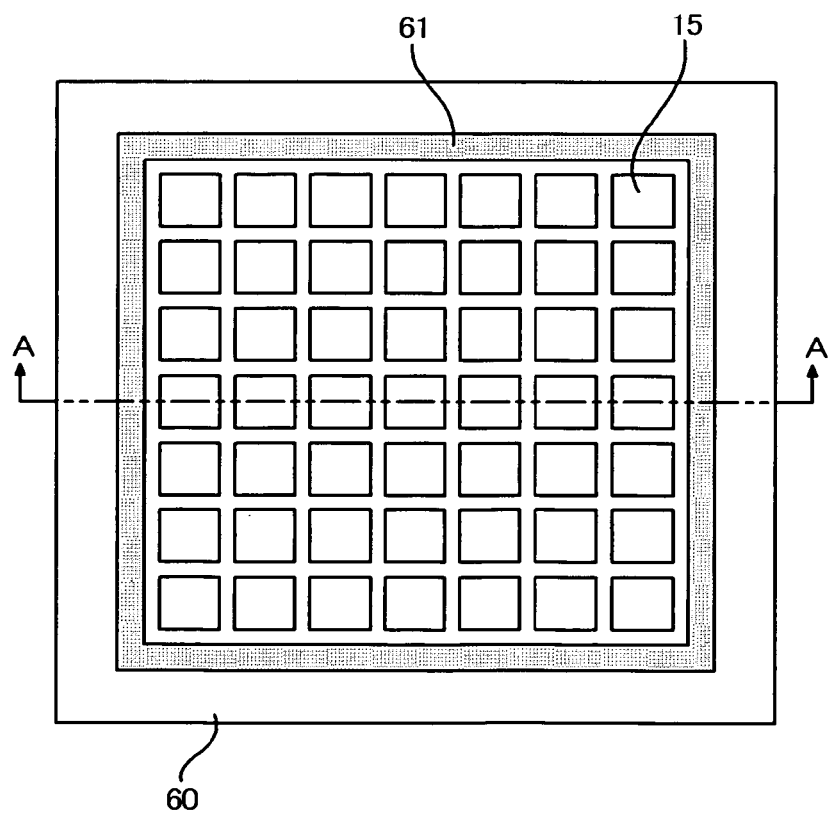
FIG. 14 is a plan view of a baseboard according to a fourth embodiment of the present invention.

FIG. 14 shows a plan view of a baseboard 60 according to a fourth embodiment of the present invention. The baseboard 60 has a single dummy cavity 61 that totally surrounds the two-dimensional array of the regular cavities 15. The dummy cavity 61 has a rectangular or square shape and is formed as if the dummy cavities 15 used in the first embodiment are unified. The dummy cavities 61 that surround the two-dimensional array of the regular cavities 15 bring about effects similar to those of the first through third embodiments mentioned before. The baseboard 60 may be fabricated in the same manner as the baseboards 10, 40 and 50.

The present invention is not limited to the specifically described embodiments, and includes other embodiments and variations. For example, the chips that are packaged are not limited to the SAW filter chips but may be any electronic elements. The devices are not limited to the SAW devices but may be any electronic devices.

The present invention is based on Japanese Patent Application No. 2003-036749 filed on Feb. 14, 2003, and the entire disclosure of which is hereby incorporated by reference.

What is claimed is:

1. A method of fabricating electronic parts comprising the steps of:
   (a) mounting electronic elements in regular cavities that are two-dimensional array arranged on a baseboard on which dummy cavities are provided so as to be located further out than the array of the regular cavities and surround the array of the regular cavities wherein there are no dummy cavities located between any adjacent pair of regular cavities in the array, and wherein no electronic elements are mounted in the dummy cavities; and (b) covering a top of the baseboard with a resin sheet.

2. The method as claimed in claim 1, wherein the step (b) includes a step of supplying resin of the resin sheet to given dummy cavities having bottoms that are not metallized.

3. The method as claimed in claim 1, wherein the step (b) includes a step of placing the resin sheet on the top of the baseboard so as to cover the regular and dummy cavities and pressurizing the resin sheet while heating, so that the regular and dummy cavities can be hermetically sealed.

4. The method as claimed in claim 1, further comprising a step (c) of dividing the baseboard into separate electronic parts each of which includes one of the electronic elements in a corresponding one of the regular cavities.

5. The method as claimed in claim 1, wherein the dummy cavities are at least 150 μm away from regular cavities located at outermost positions.

6. The method as claimed in claim 1, wherein the dummy cavities are away from regular cavities located at outermost positions at a distance equal to that at which the regular cavities are two-dimensionally arranged.

7. The method as claimed in claim 1, wherein the dummy cavities are away from regular cavities located at outermost positions at a distance equal to or longer than a gap between sidewalls of the regular cavities and the electronic elements in the regular cavities.

8. The method as claimed in claim 1, wherein the dummy cavities are arranged in rows and columns of a two-dimensional arrangement of the regular cavities.

9. The method as claimed in claim 1, wherein each of the dummy cavities, is arranged common to at least two rows and columns of a two-dimensional arrangement of the regular cavities.

10. The method as claimed in claim 1, wherein the dummy cavities make a single groove that totally surrounds a two-dimensional arrangement of the regular cavities.

11. The method as claimed in claim 1, wherein the dummy cavities are at least 50 μm deep.

12. The method as claimed in claim 1, further comprising a step of attaching a wiring board to a backside of the baseboard so that terminals on the wiring boards are electrically connected to terminals in the regular cavities by via interconnections provided in the baseboard.

13. The method as claimed in claim 1, wherein the electronic elements are surface acoustic wave filter chips, and the electronic parts are surface acoustic wave devices.

* * * * *

UNITED STATES PATENT AND TRADEMARK OFFICE
CERTIFICATE OF CORRECTION

PATENT NO. : 7,200,924 B2
APPLICATION NO. : 10/777135
DATED : April 10, 2007
INVENTOR(S) : Shingo Masuko It is certified that error appears in the above-identified patent and that said Letters Patent is hereby corrected as shown below:

Title Page

Item (56), References Cited, U.S. Patent Documents, please change

"6,923,958 B2 *    8/2005    Xiang et al." to

-- 5,923,958 A *    7/1999    Chou --

Signed and Sealed this

Nineteenth Day of June, 2007

JON W. DUDAS
*Director of the United States Patent and Trademark Office*